US008928863B2

(12) United States Patent
Thielen et al.

(10) Patent No.: US 8,928,863 B2
(45) Date of Patent: Jan. 6, 2015

(54) SYSTEMS AND METHODS FOR GENERATING AN OPTICAL PULSE

(75) Inventors: Peter A. Thielen, Long Beach, CA (US); Eric Cheung, Torrance, CA (US); Timothy McComb, Hermosa Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 168 days.

(21) Appl. No.: 13/102,684

(22) Filed: May 6, 2011

(65) Prior Publication Data

US 2012/0281199 A1 Nov. 8, 2012

(51) Int. Cl.

| | |
|---|---|
| ***G01C 3/08*** | (2006.01) |
| ***H01S 5/50*** | (2006.01) |
| ***H01S 5/062*** | (2006.01) |
| *H01S 5/00* | (2006.01) |
| *H01S 5/065* | (2006.01) |
| *H01S 5/40* | (2006.01) |

(52) U.S. Cl.

CPC ........... *H01S 5/5045* (2013.01); *H01S 5/06216* (2013.01); *H01S 5/0057* (2013.01); *H01S 5/0654* (2013.01); *H01S 5/4006* (2013.01)

USPC ........... 356/5.01; 356/4.01; 356/28; 359/333; 359/349; 359/340; 359/341.2

(58) Field of Classification Search

USPC .......... 356/4.01, 5.01, 28; 359/333, 349, 340, 359/341.2

See application file for complete search history.

(56) References Cited

U.S. PATENT DOCUMENTS

| | | | | |
|---|---|---|---|---|
| 4,928,316 | A * | 5/1990 | Heritage et al. | 398/199 |
| 4,980,891 | A | 12/1990 | Izadpanah | |
| 5,477,379 | A | 12/1995 | Chang | |
| 5,546,415 | A * | 8/1996 | Delfyett et al. | 372/25 |
| 5,778,015 | A * | 7/1998 | Gunning et al. | 372/25 |
| 6,016,324 | A | 1/2000 | Rieger et al. | |
| 6,751,240 | B2 | 6/2004 | Arisawa et al. | |
| 7,257,302 | B2 * | 8/2007 | Fermann et al. | 385/125 |
| 7,453,552 | B1 * | 11/2008 | Miesak | 356/4.01 |
| 7,489,440 | B2 * | 2/2009 | Atkins et al. | 359/344 |
| 7,656,578 | B2 * | 2/2010 | Galvanauskas et al. | 359/333 |
| 7,769,262 | B2 | 8/2010 | Oguri et al. | |

(Continued)

FOREIGN PATENT DOCUMENTS

| | | | | |
|---|---|---|---|---|
| WO | WO 2008/046725 A1 | | 4/2008 | |
| WO | WO 2009/138309 | * | 11/2009 | G01S 17/88 |

OTHER PUBLICATIONS

International Search Report for corresponding PCT/US2012/034913 completed Jun. 29, 2012 by Hermann Gnugesser if the EPO.

(Continued)

*Primary Examiner* — Mark Hellner
*Assistant Examiner* — Assres H Woldemaryam
(74) *Attorney, Agent, or Firm* — Tarolli, Sundheim, Covell & Tummino LLP

(57) ABSTRACT

A system for providing a sliced optical pulse is disclosed. The system can comprise a master oscillator (MO) configured to generate an optical pulse at a first spectral bandwidth. The system can also comprise a semiconductor optical amplifier (SOA) configured to slice the optical pulse to generate a sliced optical pulse that has a second spectral bandwidth. The second spectral bandwidth can be smaller than the first spectral bandwidth.

17 Claims, 3 Drawing Sheets

2
4
MASTER OSCILLATOR (MO)
6
SEMICONDUCTOR OPTICAL AMPLIFIER (SOA)
CONTROL SIGNAL

(56) References Cited

U.S. PATENT DOCUMENTS

| | | | | |
|---|---|---|---|---|
| 8,041,219 | B2 * | 10/2011 | Villa et al. | 398/91 |
| 2003/0063837 | A1 | 4/2003 | Gupta et al. | |
| 2004/0134894 | A1 * | 7/2004 | Gu et al. | 219/121.68 |
| 2004/0134896 | A1 * | 7/2004 | Gu et al. | 219/121.69 |
| 2004/0263950 | A1 * | 12/2004 | Fermann et al. | 359/333 |
| 2005/0008373 | A1 * | 1/2005 | Fujiwara et al. | 398/186 |
| 2005/0226624 | A1 * | 10/2005 | Ionov et al. | 398/102 |
| 2007/0053391 | A1 | 3/2007 | Oron et al. | |
| 2007/0199927 | A1 * | 8/2007 | Gu et al. | 219/121.69 |
| 2008/0094693 | A1 * | 4/2008 | Atkins et al. | 359/344 |
| 2009/0016388 | A1 * | 1/2009 | Gu et al. | 372/25 |
| 2009/0225401 | A1 * | 9/2009 | Chen et al. | 359/333 |
| 2011/0032605 | A1 * | 2/2011 | Kliner et al. | 359/344 |
| 2011/0149385 | A1 | 6/2011 | Bagheri et al. | |

OTHER PUBLICATIONS

Tang, et al.: "*Active Picosecond Optical Pulse Compression in Semiconductor Optical Amplifiers*"; IEEE Journal of Quantum Electronics, vol. 35, No. 1, Jan. 1999, pp. 93-100.

Aghajanpour, et al.: "*Ultra-Short Optical Pulse Shaping Using Semiconductor Optical Amplifier*"; Optics & Laser Technology 41 (2009), pp. 654-658.

US 6,609,906, May 30, 2000, Hong, et al. (withdrawn).

* cited by examiner

SYSTEMS AND METHODS FOR GENERATING AN OPTICAL PULSE

TECHNICAL FIELD

This invention relates to an optical pulse. More particularly, this invention relates to systems and methods for slicing an optical pulse.

BACKGROUND

A laser emits light (electromagnetic radiation) through a process of optical amplification based on the stimulated emission of photons. Light emitted from a laser is notable for its high degree of spatial and temporal coherence. Spatial coherence typically is expressed through an output being a narrow beam which is diffraction-limited, often a so-called "pencil beam." Laser beams can be focused to very tiny spots, achieving a very high irradiance. Alternatively, laser beams may be launched into a beam of very low divergence in order to concentrate power at a large distance.

Temporal (or longitudinal) coherence implies a polarized wave whose phase is correlated over a relatively large distance (the coherence length) along the beam. A beam produced by a thermal or other incoherent light source has an instantaneous amplitude and phase which vary randomly with respect to time and position, and thus a very short coherence length. The degree to which a laser is temporally coherent can depend on the spectral properties of the laser emission.

A laser can emit light at one or more wavelengths defined by the longitudinal modes of the laser cavity. The spacing of these modes can vary inversely with cavity length. A laser that emits light predominately in one of these cavity modes can be said to be a "single mode" or "single wavelength" laser. The degree to which the single mode laser is operating in single mode is defined by the side mode suppression ratio (SMSR), which defines the ratio of the power in the predominate mode to the power in the other modes. Typical applications would require SMSR greater than 30 decibels (dB), and some applications require SMSR greater than 50 dB.

SUMMARY OF THE INVENTION

One aspect of the invention relates to a system for providing a sliced optical pulse. The system can comprise a master oscillator (MO) configured to generate an optical pulse at a first spectral bandwidth. The system also comprises a semiconductor optical amplifier (SOA) configured to slice the optical pulse to generate a sliced optical pulse that has a second spectral bandwidth. The second spectral bandwidth can be smaller than the first spectral bandwidth. The sliced optical pulse can comprises a portion of the optical pulse.

Another aspect of the invention relates to another system for providing a sliced optical pulse. The system can comprise a multimode laser configured to provide a multimode optical pulse in response to an electrical pulse from a controller. The system can also comprise an SOA configured to slice the multimode optical pulse to generate a single mode optical pulse in response to a delayed electrical signal provided from the controller. The single mode optical pulse can comprise a portion of the multimode optical pulse.

Another aspect of the invention relates to a method for generating an optical pulse. The method can comprise generating a multimode optical pulse and slicing the multimode optical signal at an SOA to generate a single mode optical pulse. The single mode optical pulse can comprise a portion of the multimode optical pulse.

Still another aspect of the invention relates to a method for generating an optical pulse with frequency chirp. The method can comprise generating a multimode optical pulse and slicing the multimode optical pulse at an SOA to generate a single mode optical pulse with frequency chirp. The single mode optical pulse can comprise a portion of the multimode optical pulse.

DETAILED DESCRIPTION

Multimode lasers produce signals with power in multiple frequency bands which can span across a multi-nanometer bandwidth. The output of such a multimode laser can be provided to a semiconductor optical amplifier (SOA) that can be employed to slice a portion of the output of the multimode laser. Slicing of the output can reduce the bandwidth of the laser, as well as shorten the pulse output of the multimode laser.

If a laser is directly modulated by changing a pumping condition to vary an intensity of the laser or to generate an optical pulse, cavity and laser dynamics caused by transient excitation of an active medium of the laser can shift the wavelength of the cavity modes. The wavelength being shifted in time can be referred to as frequency chirp. From this shifting, the wavelength content and coherence of a modulated laser is not constant, but vary over time, especially for fast modulations. Thus, even for lasers that operate in single mode under continuous-wave operation, the wavelength may shift, broaden, temporarily operate in multimode, or mode-hop between longitudinal modes when directly modulated. The wavelength behavior under direct modulation of the laser can depend on the specifics of the laser design, but in general it can be difficult and/or expensive to obtain single frequency operation. A laser that outputs an optical signal that is not a single longitudinal mode (with or without frequency chirp) can be referred to as a multimode laser.

Figure 1:
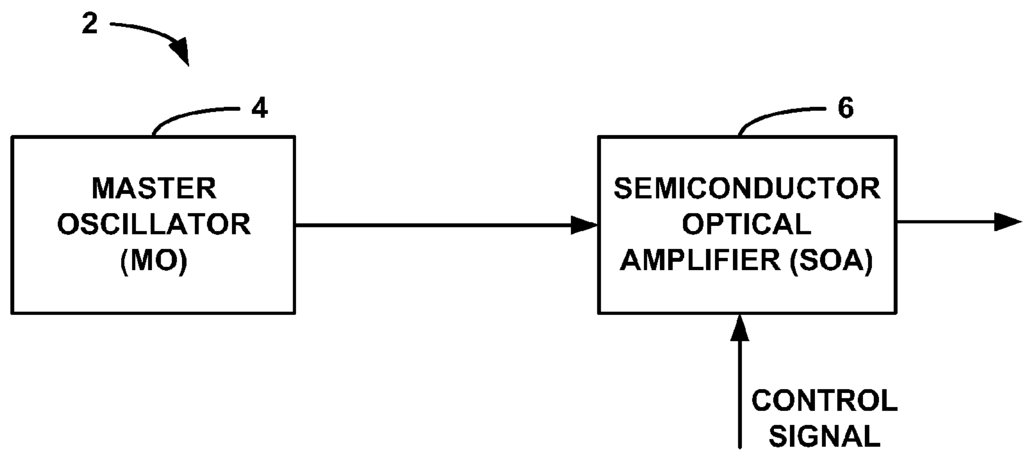
FIG. 1 illustrates an example of a system for generating an optical pulse.
Figure 2:
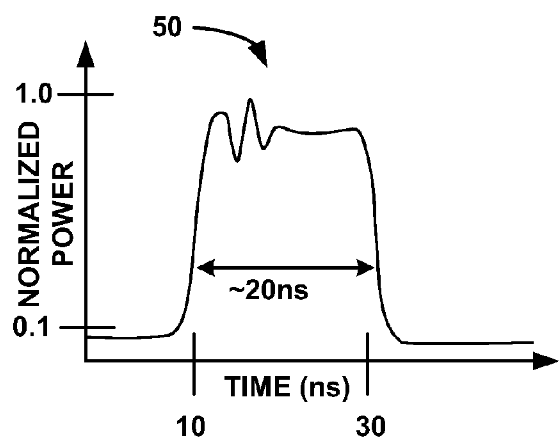
FIG. 2 illustrates an example of normalized power for an optical pulse plotted as a function of time.
Figure 3:
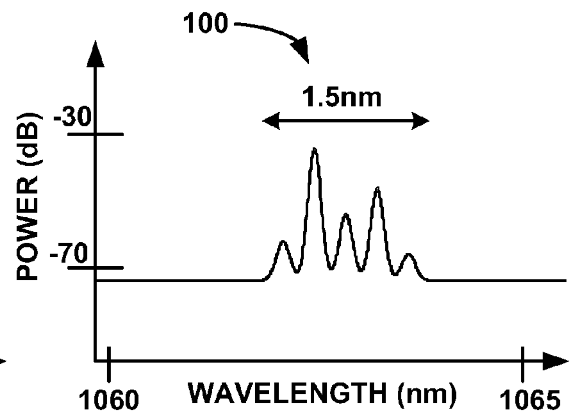
FIG. 3 illustrates an example of spectral characteristics of an optical pulse.

FIG. 1 illustrates an example of a system 2 for outputting a single mode optical pulse. The system 2 includes a master oscillator (MO) 4 configured to provide an optical pulse. In one example, the MO 4 can be implemented as an optical device, such as a laser. In some examples, the MO 4 can be implemented as a solid-state device, such as a laser diode. The MO 4 can output an optical pulse. The optical pulse output by the MO 4 can be a multimode optical pulse. FIGS. 2 and 3 illustrate an example of an optical pulse that could be output by the MO 4.

FIG. 2 illustrates a normalized power an optical pulse 50 output by an MO (such as MO 4 illustrated in FIG. 1) plotted as a function of time, in nanoseconds (ns). In one example, a normalized power of 1.0 could represent a power of about 250 milliwatts (mW), and a normalized power of about 0.1 could represent a power of about 25 mW. In other examples, the normalized power could be adjusted for a different scale. The optical pulse 50 has a pulse width of about 20 ns, although in other examples, the optical pulse 50 could have a pulse width of about 10 ns to about 100 ns. Moreover, from a time of about 10 ns to about 20 ns, the optical pulse 50 has a significant normalized power bounce which, for example can be from interference between multiple cavity modes lasing. Further, from a time of about 20 ns to about 30 ns, the optical pulse 50 has a relatively stable normalize power due to a single cavity mode lasing.

FIG. 3 illustrates spectral characteristics (e.g., measured by an optical spectrum analyzer) of the optical pulse 100 illustrated in FIG. 2. In FIG. 3, a power in decibels (dB) of the optical pulse 100 is plotted as a function of wavelength in nanometers (nm). The optical pulse 100 provides a significant amount of power at wavelengths from about 1062 nm to about 1063.5 nm, such that the optical pulse 100 has a spectral bandwidth of about 1.5 nm. Thus, the optical pulse 100 can be referred to as a multimode pulse, since the optical pulse 100 provides power over multiple wavelengths. It is to be noted that in other examples, the optical pulse 100 can have different spectral characteristics than those shown and described with respect to FIG. 3.

Referring back to FIG. 1, a significant amount of normalized power bounce and a wide spectral bandwidth of the optical pulse output by the MO 4 (as illustrated in FIGS. 2 and 3), can limit the utility of the optical pulse. In particular, in certain environments of application, such as Light Detection and Ranging (LIDAR) and communications, a short optical pulse with a relatively stable normalize power, and narrow spectral bandwidth is needed. Thus, the optical pulse output by the MO 4 can be provided to a semiconductor optical amplifier (SOA) 6 to slice the optical pulse output by the MO 4.

The SOA 6 can be implemented as an amplifier that employs a semiconductor to provide a gain medium that causes amplification of incoming light. The SOA 6 can have a similar structure to a laser diode with anti-reflection design elements at endfaces of the SOA 6. The SOA 6 can include anti-reflective coatings and tilted waveguide and window regions that can reduce endface reflection to less than 0.001%. The SOA 6 can typically be made from group III-V compound semiconductors such as GaAs/AlGaAs, InP/InGaAs, InP/InGaAsP and InP/InAlGaAs, though other materials could be employed as well. The SOA can be electrically controlled, for example by a control signal (labeled in FIG. 1 as "CONTROL SIGNAL"). For purposes of simplification of explanation, in the present example, it will be presumed that the SOA 6 is configured as a unity gain amplifier. However, in other examples, different gains could be employed.

Figure 4:
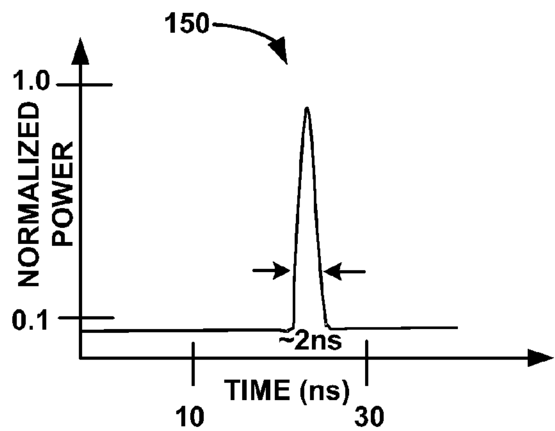
FIG. 4 illustrates an example of normalized power for a sliced optical pulse plotted as a function of time.
Figure 5:
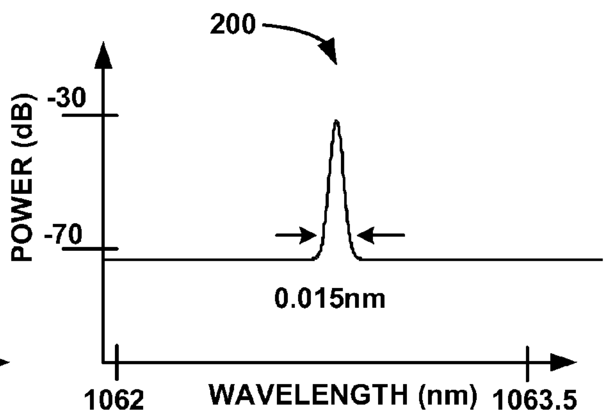
FIG. 5 illustrates an example of spectral characteristics of a sliced optical pulse.

The control signal can be provided to the SOA 6 a predetermined amount of time after initiation (e.g., a rise time) of the optical pulse output by the MO 4. In response to receipt of the control signal, the SOA 6 can output a sliced optical pulse, which for example, can be referred to as an on state. The sliced optical pulse can represent a slice (or portion of the optical pulse output by the MO). Moreover, during a time period where no control signal is provided, the SOA 6 can output an optical pulse at a low state, which for example, can be referred to as an off state. In some examples, during the pulse width of the optical signal provided by the MO 4, the output of the SOA 6 during the on state can be 35 dB higher than the SOA in a low state. FIGS. 4 and 5 illustrates an example of a sliced optical pulse output by the SOA 6.

In FIG. 4, normalized power of the sliced optical pulse 150 is plotted as a function of time. For purposes of simplification of explanation, it is to be presumed that the same period of time and normalized power scale illustrated in FIG. 2 is plotted in FIG. 4. As is illustrated in FIG. 4, the sliced optical pulse 150 has a pulse width of about 2 ns. Moreover, the sliced optical pulse 150 is initiated at about 25 ns and is ended at about 27 ns. Furthermore, the sliced optical pulse 150 has a relatively smooth normalized power curve, with little to no bounce.

FIG. 5 illustrates spectral characteristics (e.g., measured by an optical spectrum analyzer) of the sliced optical pulse 200 illustrated in FIG. 4. In FIG. 5, the power, in dB, of the sliced optical pulse 200 is plotted as a function of wavelength in nm. As is illustrated, in the present example, the sliced optical pulse 200 has a wavelength of about 1062.75 nm and a −3 dB spectral bandwidth of about 0.015 nm. However, it is to be understood that the plotted spectral bandwidth can be limited to the resolution of the optical spectrum analyzer. The true spectral bandwidth of the pulse can be less than about 400 MHz as measured by an interferometer. Accordingly, the sliced optical pulse 200 can referred to as a single mode pulse, since the sliced optical pulse 200 has a narrow bandwidth (e.g. a substantially single frequency).

The spectral bandwidth of the sliced single mode pulse 200 is predominantly determined by the amount of frequency chirp. In particular, in certain environments of application, such as optical communications and industrial high power fiber lasers, a short optical pulse with a relatively stable normalize power, and narrow spectral bandwidth with a specific amount of chirp is needed. The amount of optical chirp can be controlled by selecting a master oscillator 4 with a particular chirp characteristic, by supplying a control signal such as a ramping current to the master oscillator 4, by selecting a SOA 6 with a particular chirp characteristic, or by supplying a control signal to the SOA 6. Thus, the optical pulse output by the MO 4 can be provided to a SOA 6 to slice the optical pulse output by the MO 4 with the specific frequency chirp. Either the master oscillator 4 or the SOA 6, or both can impose frequency chirp on the sliced optical pulse 200.

Referring back to FIG. 1, as is illustrated in FIGS. 2-5, the system 2 can be configured such that the MO 4 generates an optical output, and provides the optical output to the SOA 6. Moreover, the SOA 6 can slice a portion of the optical output to generate a sliced optical pulse. The sliced optical pulse can provide an optical pulse with a shorter pulse width than the pulse width of the optical pulse provided by the MO 4. The sliced optical pulse can have a wavelength drift of 0.01 nm or less. Furthermore, the sliced optical pulse can provide an optical pulse with a smaller spectral bandwidth than that of the MO 4, which can reduce interference, and increase accuracy in certain environments of application (e.g., LIDAR, communications, etc.).

Figure 6:
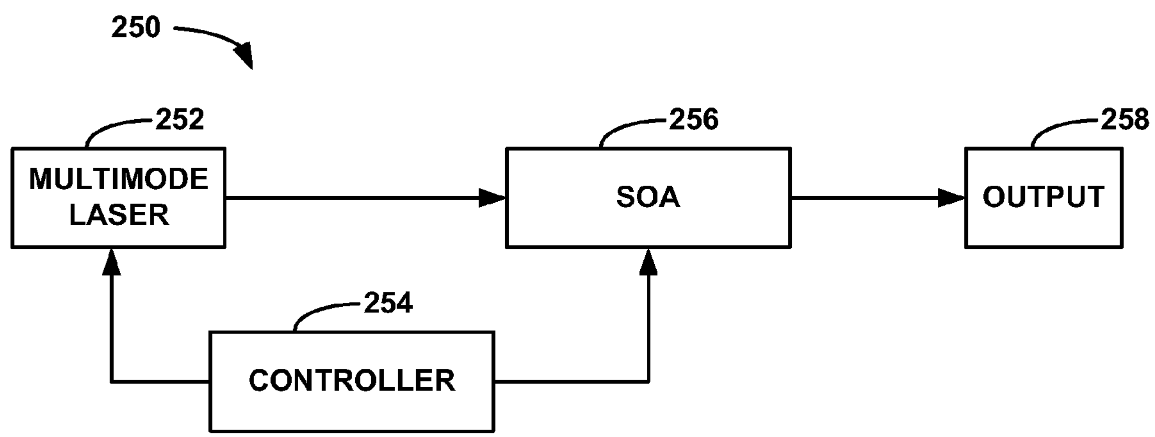
FIG. 6 illustrates another example of a system for generating an optical pulse.

FIG. 6 illustrates an example of a system 250 that can employ a multimode laser 252 to generate a single mode optical output. The system 250 could be implemented, for example, in a LIDAR system, a communication system, etc. The multimode laser 252 could be implemented, for example, as a laser diode, in a manner similar to the MO illustrated in FIG. 1. A controller 254 can control the operation of the multimode laser 252. For example, the controller 254 can provide an electrical pulse to the multimode laser 252 that causes the multimode laser 252 to generate an optical pulse. The controller 254 can be implemented, for example, as hardware (e.g., an application specific integrated circuit), software (e.g., a program executing on a processor) or combination thereof (e.g., firmware). The optical pulse provided by the multimode laser 252 can be similar to the optical pulse shown and described with respect to FIGS. 2 and 3 (e.g., a multimode optical pulse).

The multimode laser 252 can provide the multimode optical pulse to an SOA 256. The SOA 256 can be implemented in a manner similar to the SOA 6 illustrated in FIG. 1. Furthermore, the controller 254 can be configured to provide a delayed electrical pulse to the SOA 256. The delayed electrical pulse could be implemented in a manner similar to the control signal described with respect to FIG. 1. In some examples, the delayed electrical pulse can be provided by the controller 254 a predetermined amount of time after the electrical pulse is provided to the multimode laser 252. Furthermore, the delayed electrical pulse can have a shorter pulse width than the electrical pulse provided by the multimode laser 252. For instance, if the electrical pulse provided to the multimode laser 252 can have a pulse width of about 20 ns, the delayed electrical pulse can be provided about 15 ns after the start of the electrical pulse provided to the multimode laser 252, and can have a pulse width of about 2 ns.

In response to the delayed electrical pulse, the SOA 256 can slice a portion of the multimode optical pulse provided by the multimode laser 252 to generate a sliced single mode optical pulse, which can be provided to an output 258. In some examples, the output 258 could be implemented as a transducer, a fiber-optic cable, a lens, free space, etc. In other examples, the output 258 could be part of a LI DAR system. Furthermore, the sliced single mode optical pulse can have characteristics similar to the sliced optical pulse illustrated and described with respect to FIGS. 4 and 5.

By implementing the system 250, the multimode laser 252 can be employed in environments of application where a single mode optical pulse is needed. Thus, the difficulties associated with providing a single mode laser can be avoided. Furthermore, the system 250 can achieve pulse widths for the sliced single mode optical pulse that would be unattainable from a conventional multimode laser (e.g., the multimode laser 252).

Figure 7:
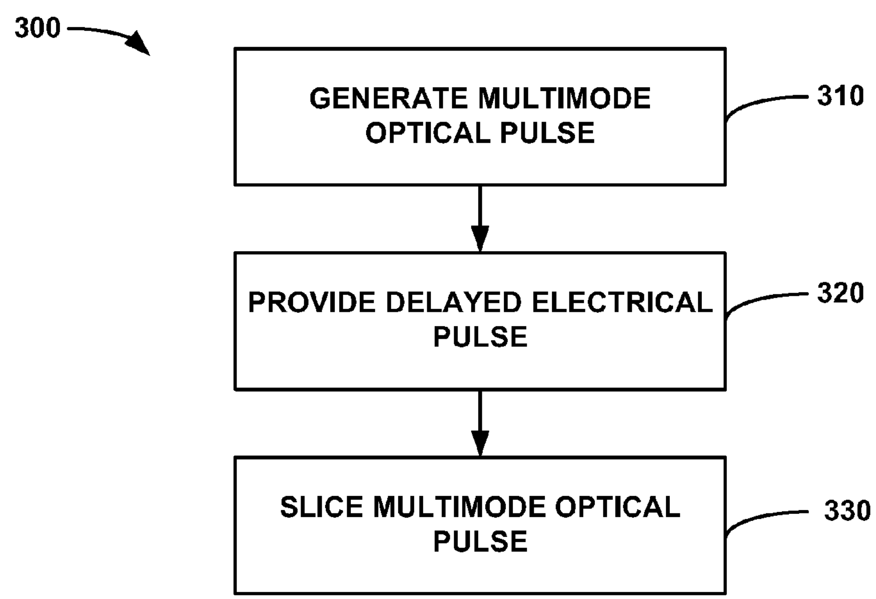
FIG. 7 illustrates an example of a flowchart of a method for generating an optical pulse.

In view of the foregoing structural and functional features described above, example methodologies will be better appreciated with reference to FIG. 7. While, for purposes of simplicity of explanation, the example methods of FIG. 7 are shown and described as executing serially, it is to be understood and appreciated that the present examples are not limited by the illustrated order, as some actions could in other examples occur in different orders and/or concurrently from that shown and described herein.

FIG. 7 illustrates an example of a flow chart for an example of a method 300 for generating a single mode optical pulse. The method 300 can be implemented, for example, by the system 2 illustrated in FIG. 1 and/or by the system 250 illustrated in FIG. 6. At 310, a multimode optical pulse can be generated, for example, by a multimode laser, or other MO. The multimode optical pulse can be implemented, for example, as an optical pulse with a wide spectral bandwidth (e.g., about 1.5 nm or greater). The multimode optical pulse can be similar to the optical pulse 50, 100 illustrated and described with respect to FIGS. 2 and 3. At 320 a delayed electrical pulse can be provided to an SOA. The delayed electrical pulse can be provided a predetermined amount of time after the multimode optical pulse is generated. At 330, the multimode optical pulse can be sliced at the SOA to generate a single mode optical pulse. The single mode optical pulse can be implemented, for example, as an optical pulse with a narrow spectral bandwidth (e.g., about 0.015 nm or less) and a relatively short pulse width (e.g., about 2 ns or less). As one example, the single mode optical pulse could be implemented as the sliced optical pulse 150, 200 illustrated in FIGS. 4 and 5.

What have been described above are examples. It is, of course, not possible to describe every conceivable combination of components or methods, but one of ordinary skill in the art will recognize that many further combinations and permutations are possible. Accordingly, the invention is intended to embrace all such alterations, modifications, and variations that fall within the scope of this application, including the appended claims.

What is claimed is:

1. A system for providing a sliced optical pulse comprising:
a multimode laser configured to provide a multimode optical pulse in response to an electrical pulse from a controller, wherein the multimode optical pulse comprises output power in multiple frequency bands; and
a semiconductor optical amplifier (SOA) configured to slice the multimode optical pulse to generate a single mode optical pulse in response to a delayed electrical signal provided from the controller, wherein the single mode optical pulse comprises a portion of the multimode optical pulse.

2. The system of claim 1, wherein the controller is configured to provide the delayed electrical pulse to the SOA a predetermined amount of time after providing the electrical pulse to the multimode laser.

3. The system of claim 2, wherein the multimode laser comprises a laser diode.

4. The system of claim 1, wherein the single mode optical pulse has a pulse width less than the multimode optical pulse.

5. The system of claim 1, wherein the single mode optical pulse has a pulse width of about 2 nanoseconds, and the multimode optical pulse has a pulse width of at least 10 nanoseconds.

6. The system of claim 1, wherein the single mode optical pulse has a spectral bandwidth of 400 MHz or less.

7. The system of claim 1, wherein the single mode pulse is provided at a peak power of about 250 milliwatts or greater.

8. A Light Detecting and Ranging (LIDAR) system comprising the system of claim 1.

9. A method for generating an optical pulse comprising:
generating a multimode optical pulse;
providing a delayed electrical pulse to a semiconductor optical amplifier (SOA) a predetermined amount of time after the multimode optical pulse is generated, wherein the multimode optical pulse comprises output power in multiple frequency bands; and
slicing the multimode optical pulse in response to the delayed electrical pulse at the SOA to generate a single mode optical pulse comprising a portion of the multimode optical pulse.

10. The method of claim 9, wherein the multimode optical pulse is generated by a laser diode that has multiple longitudinal modes lasing therein.

11. The method of claim 9, wherein the single mode optical pulse has a pulse width less than a pulse width of the multimode optical pulse.

12. The method of claim 11, wherein the single mode optical pulse has a pulse width of about 2 nanoseconds and the multimode optical pulse has a pulse width of about 10 nanoseconds or greater.

13. The method of claim 9, wherein the multimode optical pulse and the single mode optical pulse each have a frequency chirp.

14. The method of claim 13, wherein the multimode optical pulse is generated by a laser diode.

15. The method of claim 14, further comprising providing a delayed electrical pulse to the SOA a predetermined amount of time after the optical pulse is generated.

16. The system of claim 1, wherein the laser is configured to generate multiple longitudinal modes lasing therein in response to the electrical pulse to generate the multimode optical pulse.

17. The system of claim 1, wherein the multimode optical pulse has a bandwidth of about 1.5 nanometers or greater and the single mode optical pulse has a bandwidth of about 400 MHz or less.

* * * * *